(12) United States Patent
Li et al.

(10) Patent No.: US 7,282,773 B2
(45) Date of Patent: Oct. 16, 2007

(54) SEMICONDUCTOR DEVICE WITH HIGH-K DIELECTRIC LAYER

(75) Inventors: Hong-Jyh Li, Austin, TX (US); Mark Gardner, Cedar Creek, TX (US)

(73) Assignees: Advanced Micro Devices Inc., Sunnyvale, CA (US); Infineon Technologies AG, Munich (DE)

( * ) Notice: Subject to any disclaimer, the term of this patent is extended or adjusted under 35 U.S.C. 154(b) by 222 days.

(21) Appl. No.: 10/940,055

(22) Filed: Sep. 14, 2004

(65) Prior Publication Data
US 2006/0125026 A1    Jun. 15, 2006

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. .................. 257/411; 257/408; 257/412

(58) Field of Classification Search ......... 257/382–412
See application file for complete search history.

(56) References Cited

U.S. PATENT DOCUMENTS

| 6,407,435 | B1 | 6/2002 | Ma et al. |
| 6,627,503 | B2 | 9/2003 | Ma et al. |
| 6,642,573 | B1 | 11/2003 | Halliyal et al. |
| 6,657,276 | B1 * | 12/2003 | Karlsson et al. ............ 257/506 |
| 6,660,660 | B2 | 12/2003 | Haukka et al. |
| 6,674,138 | B1 | 1/2004 | Halliyal et al. |
| 6,693,051 | B2 | 2/2004 | Muller et al. |
| 6,750,066 | B1 | 6/2004 | Cheung et al. |
| 6,754,108 | B2 | 6/2004 | Forbes |
| 2004/0051134 | A1 | 3/2004 | Jang et al. |
| 2006/0115937 | A1 * | 6/2006 | Barnett et al. .............. 438/151 |

* cited by examiner

*Primary Examiner*—Cuong Nguyen
(74) *Attorney, Agent, or Firm*—Dicke, Billig & Czaja, PLLC (57) ABSTRACT

A semiconductor device comprises a substrate including isolation regions and active regions, and a high-k dielectric layer proximate the substrate. The high-k dielectric layer comprises a mixture formed by annealing at least one high-k material and at least one metal to oxidize the metal. The semiconductor device comprises a gate electrode proximate the high-k dielectric layer.

19 Claims, 8 Drawing Sheets

SEMICONDUCTOR DEVICE WITH HIGH-K DIELECTRIC LAYER

CROSS-REFERENCE TO RELATED APPLICATIONS

This application is related to U.S. patent application Ser. No. 10/799,910, filed Mar. 12, 2004, which is incorporated herein by reference.

BACKGROUND

As metal-oxide semiconductor field effect transistor (MOSFET) devices continue to advance, the thickness of the gate dielectric continues to decrease to maintain the desired control of the MOSFET devices. According to the International Technology Roadmap for Semiconductors (ITRS), an equivalent oxide thickness (EOT) of less than 15 Å is necessary to meet the requirement of sub-100 nm MOSFET devices. Using conventional $SiO_2$ as the gate material, it is difficult to keep scaling the thickness below 20 Å without having high tunneling leakage current through the gate. Thus, various other gate dielectric materials having a higher dielectric constant (k) than $SiO_2$ have been studied extensively. These materials are known as high-k materials. $SiO_2$ has a k value of 3.9 while the various other gate dielectric materials being studied have k values in the range of 10 to 80.

The thickness of the gate dielectric required to control a MOSFET depends on the capacitance of the film. High-k material films and the thicknesses that would result may be compared to other high-k materials and $SiO_2$ using equivalent oxide thickness (EOT). For example, a high-k film with a k value of 20 may be about five times thicker than a $SiO_2$ film and still have the same control over a MOSFET. The thicker gate dielectric layer may reduce tunneling leakage current through the gate, enabling sub-100 nm MOSFET devices.

SUMMARY

One embodiment of the present invention provides a semiconductor device. The semiconductor device comprises a substrate including isolation regions and active regions, and a high-k dielectric layer proximate the substrate. The high-k dielectric layer comprises a mixture formed by annealing at least one high-k material and at least one metal to oxidize the metal. The semiconductor device comprises a gate electrode proximate the high-k dielectric layer.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

Figure 1:
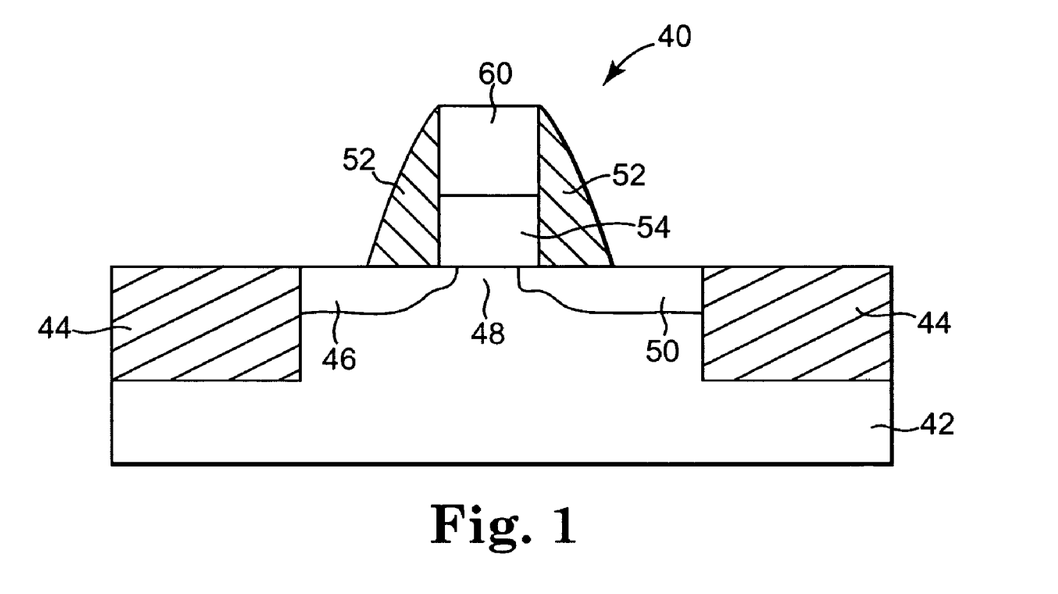
FIG. 1 is a diagram illustrating a cross-section of one embodiment of a metal-oxide semiconductor field effect transistor (MOSFET) cell, according to the present invention.

FIG. 1 is a diagram illustrating a cross-section of one embodiment of a metal-oxide semiconductor field effect transistor (MOSFET) cell 40, according to the present invention. Transistor cell 40 is one of a plurality of transistor cells in a MOSFET device. In one embodiment, transistor cell 40 is used in a memory device. Transistor cell 40 includes substrate 42, isolation regions 44, source 46, channel 48, and drain 50. Transistor cell 40 also includes high-k dielectric layer 54, gate electrode 60, and spacers 52. In one embodiment, high-k dielectric layer 54 is formed by annealing two or more materials or two or more layers of materials to form a single high-k dielectric layer comprising a mixture of the materials or material layers. In one embodiment, one or more of the materials includes a high-k material and one or more of the materials includes a metal. The annealing process, in one embodiment, results in a high-k dielectric layer incorporated with N and having a high-k value greater than the individual k values of each material in the mixture. Desired memory cell 40 characteristics, including equivalent oxide thickness (EOT) and N incorporation, are obtained by selecting the materials, number of layers, and thicknesses of each layer.

Substrate 42 is a silicon substrate or other suitable substrate. Isolation regions 44 are trenches etched into substrate 42 that have been filled with an insulating material, such as $SiO_2$ or other suitable insulator with a dielectric constant less than four, to insulate transistor cell 40 from adjacent transistor cells. Source 46 and drain 50 are doped, for example, with arsenic, phosphorous, boron or other suitable material, depending upon the desired transistor cell characteristics, using a self-aligning ion implantation process in substrate 42 or other suitable process. Channel 48 is between source 46 and drain 50.

High-k dielectric layer 54 is centered over channel 48 and includes a mixture of two or more high-k dielectric materials and metals. The high-k dielectric materials include $Si_3N_4$, $Al_2O_3$, $Ta_2O_5$, $HfO_2$, $TiO_2$, $HfSiO_x$, $ZrO_2$, $ZrSiO_x$, $La_2O_3$, $CeO_2$, $Bi_4Si_2O_{12}$, $WO_3$, $Y_2O_3$, $LaAlO_3$, BST ($Ba_{(a-x)}Sr_x$-$TiO_3$), PST ($PbSc_xTa_{(1-a)}O_3$), PZN ($PbZn_xNb_{(1-x)}O_3$), PZT ($PbZr_xTi_{(1-x)}O_3$), PMN ($PbMg_xNb_{(1-x)}O_3$), or other suitable high-k materials. The metals include TiN, HfN, TaN, ZrN, LaN, or other suitable metals. High-k dielectric layer 54 is deposited on substrate 42. High-k dielectric layer 54 provides the gate dielectric for transistor cell 40.

Gate electrode layer 60 is deposited on high-k dielectric layer 54 and includes aluminum, polysilicon, or other suitable conductive material (i.e., TiN, TaN, HfN, RuN, WN, W, MoN, TaSiN, RuSiN, WSiN, HfSiN, TiSiN, etc). Gate electrode layer 60 provides the gate electrode for transistor cell 40.

Spacers 52 are deposited on the sides of gate electrode layer 60, high-k dielectric layer 54, and substrate 42 and include $SiO_2$, $Si_3N_4$, TEOS or other suitable dielectric material. Spacers 52 isolate gate electrode 60 and high-k dielectric layer 54 from source 46 and drain 50.

Using a high-k dielectric layer 54 improves the high-k quality for the gate dielectric. High-k dielectric layer 54 provides an equivalent oxide thickness (EOT) that allows increased performance and reduced transistor cell size while not increasing tunneling leakage current through the gate. Tunneling leakage current through the gate is kept to a desired level as high-k materials improve control over transistor cell devices. The improved control comes without reducing the thickness of the gate dielectric, as required if using $SiO_2$ for the gate dielectric.

Of the high-k materials, $HfO_2$ films are compatible with both polysilicon and metal gate electrodes. $HfO_2$, however, has a low immunity to oxygen and boron diffusion. Incorporating N or another suitable species into $HfO_2$ films reduces impurity diffusion, increases crystallization temperature, improves thermal stability, etc.

FIGS. 2-14 are diagrams illustrating an exemplary process for fabricating one embodiment of transistor cell 40. In the exemplary process, transistor cell 40 is fabricated from substrate 42, high-k dielectric layer 54, gate electrode 60, and spacers 52.

Figure 2:
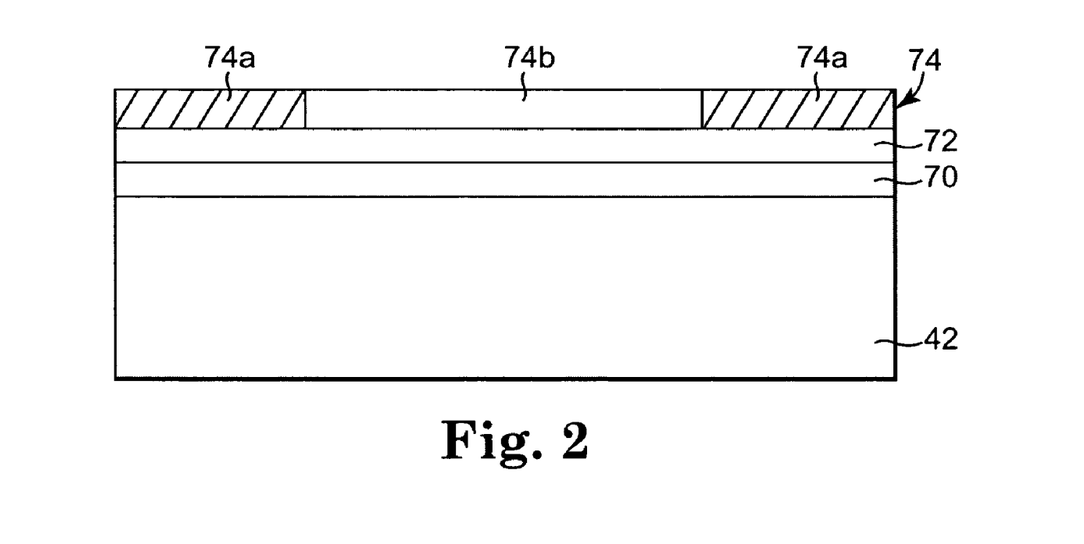
FIG. 2 is a diagram illustrating a cross-section of one embodiment of a photoresist layer, a nitride layer, an oxide layer, and a substrate.

FIG. 2 is a diagram illustrating a cross-section of one embodiment of a photoresist layer 74, a nitride layer 72, an oxide layer 70, and substrate 42. Isolation regions 44 can be formed using a shallow trench isolation (STI) process. Oxide layer 70 is formed on substrate 42. Nitride layer 72 is formed on oxide layer 70 and photoresist layer 74 is formed on nitride layer 72.

Oxide layer 70 is grown or deposited on silicon substrate layer 42. Nitride layer 72 is deposited on oxide layer 70 using chemical vapor deposition (CVD) or other suitable deposition method. Photoresist layer 74 is spin-coated on nitride layer 72. A mask is used to expose portions 74a of photoresist layer 74 and prevent portions 74b of photoresist layer 74 from being exposed. Photoresist layer 74 is exposed to high intensity ultra-violet (UV) light through the mask to expose portions 74a of photoresist layer 74. Portions 74a of photoresist layer 74 define where isolation regions 44 will be formed in substrate 42.

The exposed portions 74a of photoresist are removed to leave unexposed portions 74b of photoresist on nitride layer 72. The newly exposed nitride layer 72 portions, the oxide layer 70 portions beneath the newly exposed nitride layer 72 portions, and portions of substrate 42 beneath the newly exposed nitride layer 72 portions are etched away using wet etching, dry etching, or other suitable etching process. After etching, the newly formed trenches are filled with oxide using chemical vapor deposition (CVD) or other suitable deposition technique.

Figure 3:
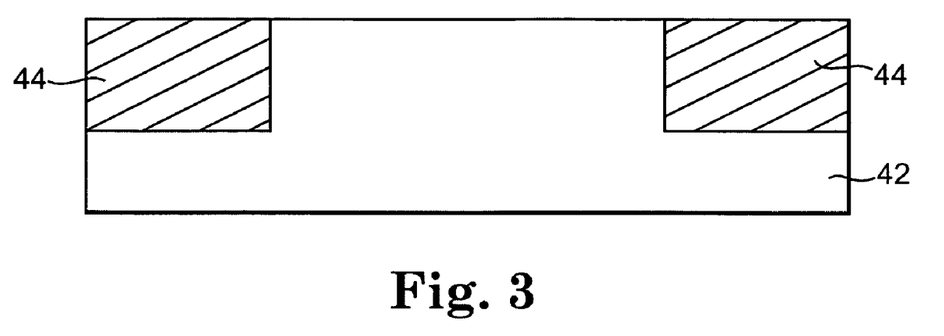
FIG. 3 is a diagram illustrating a cross-section of one embodiment of a substrate including isolation regions.

FIG. 3 is a diagram illustrating a cross-section of one embodiment of substrate 42 with isolation regions 44 formed in the substrate from the etching process previously described and illustrated in FIG. 2. In addition, the remaining nitride layer 72 and oxide layer 70 are removed from substrate 42. Depending upon the desired characteristics for the transistor cell device, substrate 42 can be implanted to form n-wells and/or p-wells and $V_{tn}$ and/or $V_{tp}$ adjust implants can be performed.

Figure 4:
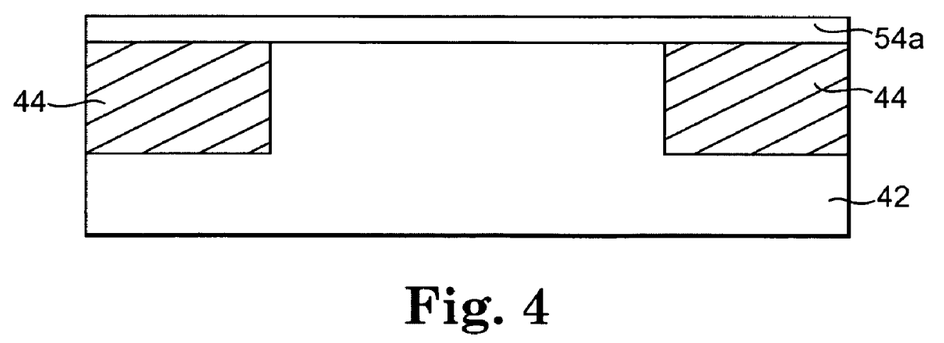
FIG. 4 is a diagram illustrating a cross-section of one embodiment of a substrate with isolation regions and first material layer.

FIG. 4 is a diagram illustrating a cross-section of one embodiment of substrate 42 with isolation regions 44 and a first material layer 54a. A pre-gate treatment is used to clean and treat the surface of substrate 42. In one embodiment, the pre-gate treatment leaves a layer including $SiO_2$, SiON, or other material based upon the pre-gate treatment used. In one embodiment, the pre-gate treatment of substrate 42 does not leave a pre-gate material layer on substrate 42. In this case, first material layer 54a is deposited on substrate 42. In one embodiment, first material layer 54a has a thickness within the range of 1 Å to 30 Å.

First material layer 54a includes one or more of $Si_3N_4$, $Al_2O_3$, $Ta_2O_5$, $HfO_2$, $TiO_2$, $HfSiO_x$, $ZrO_2$, $ZrSiO_x$, $La_2O_3$, $CeO_2$, $Bi_4Si_2O_{12}$, $WO_3$, $Y_2O_3$, $LaAlO_3$, BST, PST, PZN, PZT, PMN, TiN, HfN, TaN, ZrN, LaN, or other suitable high-k dielectric material or metal. First material layer 54a is deposited on substrate 42 using atomic layer deposition (ALD), metal organic chemical vapor deposition (MOCVD), plasma vapor deposition (PVD), jet vapor deposition (JVD), or other suitable deposition technique. In one embodiment, where first material layer 54a includes more than one of the above listed materials, the materials are simultaneously deposited.

For example, in one embodiment, $HfO_2$, $TiO_2$, $Ta_2O_5$, TaN, or TiN is deposited on substrate 42. In another embodiment, $HfO_2$, $TiO_2$, and $Ta_2O_5$, or $HfO_2$, TiN, and TaN are simultaneously deposited on substrate 42. In another embodiment, $TiO_2$, and $Ta_2O_5$, or TiN and TaN, are simultaneously deposited on substrate 42. In another embodiment, $HfO_2$ and $Ta_2O_5$, $TiO_2$, TiN, or TaN are simultaneously deposited on substrate 42. In other embodiments, other combinations of materials for first material layer 54a are used.

Figure 5:
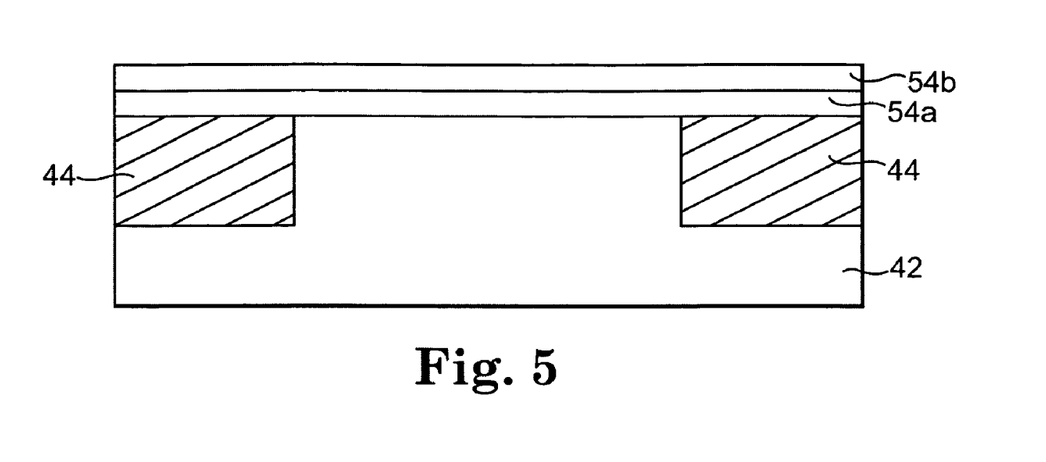
FIG. 5 is a diagram illustrating a cross-section of one embodiment of a substrate with isolation regions, first material layer, and second material layer.

FIG. 5 is a diagram illustrating a cross-section of one embodiment of substrate 42 with isolation regions 44, first material layer 54a, and second material layer 54b. Second material layer 54b includes one or more of $Si_3N_4$, $Al_2O_3$, $Ta_2O_5$, $HfO_2$, $TiO_2$, $HfSiO_x$, $ZrO_2$, $ZrSiO_x$, $La_2O_3$, $CeO_2$, $Bi_4Si_2O_{12}$, $WO_3$, $Y_2O_3$, $LaAlO_3$, BST, PST, PZN, PZT, PMN, TiN, HfN, TaN, ZrN, LaN, or other suitable high-k dielectric material or metal. Second material layer 54b is deposited on first material layer 54a using ALD, MOCVD, PVD, JVD, or other suitable deposition technique, as described with reference to first material layer 54a. In one embodiment, second material layer 54b has a thickness within the range of 1 Å to 30 Å.

In one embodiment, first material layer 54a comprises $HfO_2$, and second material layer 54b comprises $Ta_2O_5$, $TiO_2$ TiN, or TaN. In another embodiment, first material layer 54a comprises $Ta_2O_5$, $TiO_2$, TiN, or TaN and second material layer 54b comprises $HfO_2$. In other embodiments, other combinations of materials for first material layer 54a and second material layer 54b are used.

Figure 6:
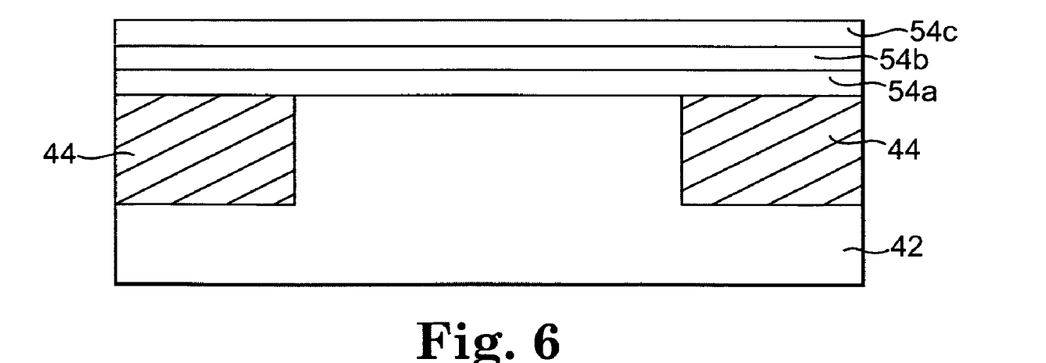
FIG. 6 is a diagram illustrating a cross-section of one embodiment of a substrate with isolation regions, first material layer, second material layer, and third material layer.

FIG. 6 is a diagram illustrating a cross-section of one embodiment of substrate 42 with isolation regions 44, first material layer 54a, second material layer 54b, and third material layer 54c. Third material layer 54c includes one or more of $Si_3N_4$, $Al_2O_3$, $Ta_2O_5$, $HfO_2$, $TiO_2$, $HfSiO_x$, $ZrO_2$, $ZrSiO_x$, $La_2O_3$, $CeO_2$, $Bi_4Si_2O_{12}$, $WO_3$, $Y_2O_3$, $LaAlO_3$, BST, PST, PZN, PZT, PMN, TiN, HfN, TaN, ZrN, LaN, or other suitable high-k dielectric material or metal. Third material layer 54c is deposited on second material layer 54b using ALD, MOCVD, PVD, JVD, or other suitable deposition technique, as described with reference to first material layer 54a. In one embodiment, third material layer 54c has a thickness within the range of 1 Å to 30 Å.

In one embodiment, third material layer 54c comprises the material or materials included in first material layer 54a. In another embodiment, third material layer 54c comprises a different material or materials than the material or materials included in first material layer 54a and/or second material layer 54b. For example, in one embodiment, first material layer 54a comprises $HfO_2$, second material layer 54b comprises $Ta_2O_5$ or TaN, and third material layer 54c comprises $TiO_2$ or TiN. In other embodiments, other combinations of materials for first material layer 54a, second material layer 54b, and third material layer 54c are used.

Figure 7:
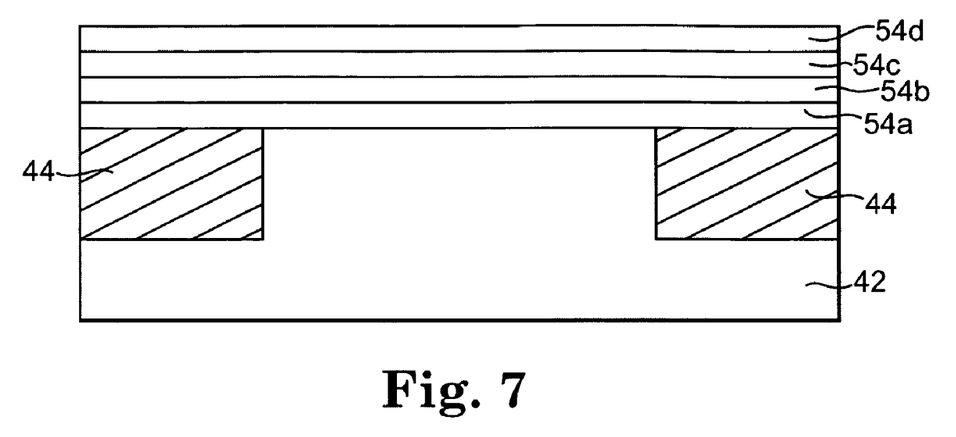
FIG. 7 is a diagram illustrating a cross-section of one embodiment of a substrate with isolation regions, first material layer, second material layer, third material layer, and fourth material layer.

FIG. 7 is a diagram illustrating a cross-section of one embodiment of substrate 42 with isolation regions 44, first material layer 54a, second material layer 54b, third material layer 54c, and fourth material layer 54d. Fourth material layer 54d includes one or more of $Si_3N_4$, $Al_2O_3$, $Ta_2O_5$, $HfO_2$, $TiO_2$, $HfSiO_x$, $ZrO_2$, $ZrSiO_x$, $La_2O_3$, $CeO_2$, $Bi_4Si_2O_{12}$, $WO_3$, $Y_2O_3$, $LaAlO_3$, BST, PST, PZN, PZT, PMN, TiN, HfN, TaN, ZrN, LaN, or other suitable high-k dielectric material or metal. Fourth material layer 54d is deposited on third material layer 54c using ALD, MOCVD, PVD, JVD, or other suitable deposition technique, as described with reference to first material layer 54a. In one embodiment, fourth material layer 54d has a thickness within the range of 1 Å to 30 Å.

In one embodiment, fourth material layer 54d comprises the material or materials included in second material layer 54b, and third material layer 54c comprises the material or materials included in first material layer 54a. For example, in one embodiment, first material layer 54a and third material layer 54c comprise $HfO_2$, and second material layer 54b and fourth material layer 54d comprise one or more of $Ta_2O_5$, $TiO_2$, TaN, and TiN. In other embodiments, other combinations of materials for first material layer 54a, second material layer 54b, third material layer 54c, and fourth material layer 54d are used.

Figure 8A:
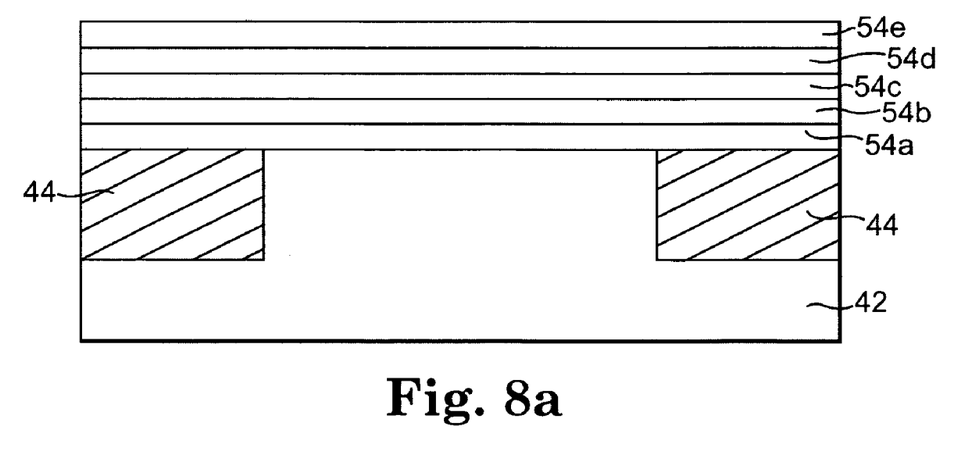
FIG. 8a is a diagram illustrating a cross-section of one embodiment of a substrate with isolation regions, first through fourth material layers, and a fifth material layer.

FIG. 8a is a diagram illustrating a cross-section of one embodiment of substrate 42 with isolation regions 44, first material layer 54a, second material layer 54b, third material layer 54c, fourth material layer 54d, and fifth material layer 54e. Fifth material layer 54e includes one or more of $Si_3N_4$, $Al_2O_3$, $Ta_2O_5$, $HfO_2$, $TiO_2$, $HfSiO_x$, $ZrO_2$, $ZrSiO_x$, $La_2O_3$, $CeO_2$, $Bi_4Si_2O_{12}$, $WO_3$, $Y_2O_3$, $LaAlO_3$, BST, PST, PZN, PZT, PMN, TiN, HfN, TaN, ZrN, LaN, or other suitable high-k dielectric material or metal. Fifth material layer 54e is deposited on fourth material layer 54d using ALD, MOCVD, PVD, JVD, or other suitable deposition technique, as described with reference to first material layer 54a. In one embodiment, fifth material layer 54e has a thickness within the range of 1 Å to 30 Å.

In one embodiment, fifth material layer 54e comprises the material or materials included in first material layer 54a and third material layer 54c, and fourth material layer 54d comprises the material or materials included in second material layer 54b. In another embodiment, fifth material layer 54e comprises the material or materials included in second material layer 54b, and fourth material layer 54d comprises the material or materials included in first material layer 54a. For example, in one embodiment, first material layer 54a, third material layer 54c, and fifth material layer 54e, comprise $HfO_2$, and second material layer 54b and fourth material layer 54d comprise one or more of $Ta_2O_5$, $TiO_2$, TaN, and TiN. In other embodiments, other combinations of materials for first material layer 54a, second material layer 54b, third material layer 54c, fourth material layer 54d, and fifth material layer 54e are used.

Figure 8B:
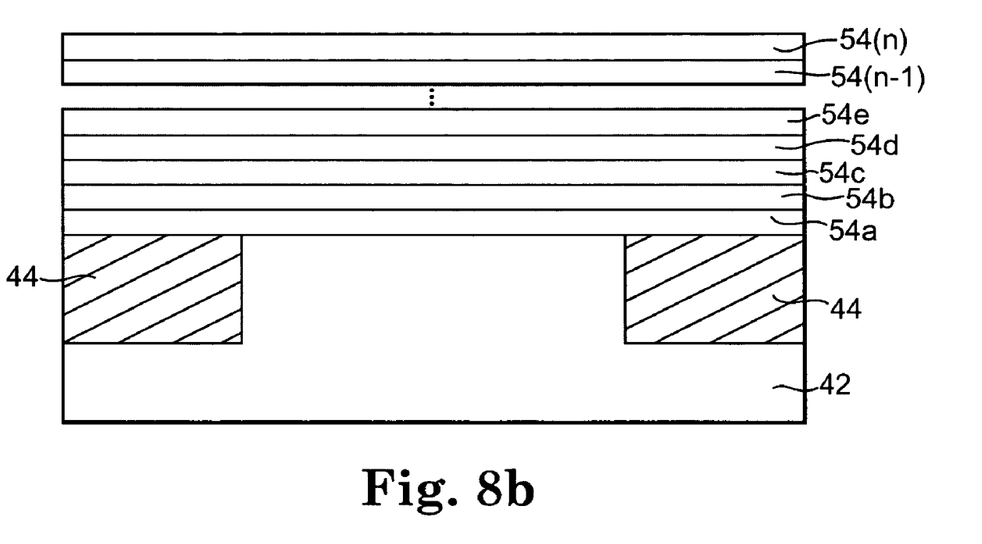
FIG. 8b is a diagram illustrating a cross-section of one embodiment of multiple material layers.

FIG. 8b is a diagram illustrating a cross-section of one embodiment of substrate 42 with isolation regions 42 and multiple material layers 54a-54(n), where n is any number greater than one. Each material layer 54a-54(n) includes one or more of $Si_3N_4$, $Al_2O_3$, $Ta_2O_5$, $HfO_2$, $TiO_2$, $HfSiO_x$, $ZrO_2$, $ZrSiO_x$, $La_2O_3$, $CeO_2$, $Bi_4Si_2O_{12}$, $WO_3$, $Y_2O_3$, $LaAlO_3$, BST, PST, PZN, PZT, PMN, TiN, HfN, TaN, ZrN, LaN, or other suitable high-k dielectric material or metal. Each material layer 54a-54(n) is deposited using ALD, MOCVD, PVD, JVD, or other suitable deposition technique. In one embodiment, the combined thickness of material layers 54a-54(n) is within the range of 20 Å to 100 Å.

In one embodiment, material layers 54(n-1) and 54(n) are repeating layers of materials deposited in first material layer 54a and second material layer 54b, respectively, or are part of any suitable repeating pattern of layers based on the desired characteristics for transistor cell 40. In other embodiments, other combinations of materials for material layers 54a-54(n) are used.

With the desired layers and combinations of layers deposited on substrate 42, layers 54a-54(n) are annealed to form a single high-k dielectric layer 54. Single high-k dielectric layer 54 comprises a mixture of all the materials deposited in material layers 54a-54(n). In one embodiment, material layers 54a-54(n) are annealed within the range of 400° C. to 900° C. Each material layer 54a-54(n) is deposited in a thickness such that after the annealing process each material layer 54a-54(n) is no longer distinct from the other material layers 54a-54(n). Material layers 54a-54(n) all blend and mix together to become a single layer. In the case of a metal layer, such as TiN, HfN, TaN, ZrN, or LaN, the layer is completely oxidized to incorporate the N into dielectric layer 54. For example, in one embodiment, where one or more of material layers 54a-54(n) include TiN, HfN, TaN, ZrN, or LaN, high-k dielectric layer 54 becomes incorporated with N when the TiN, HfN, TaN, ZrN, or LaN layer or layers are oxidized during the annealing process. Incorporation of N into high-k dielectric layer 54 improves the performance characteristics of memory cell 40. In one embodiment, where material layers 54a-54(n) comprise $HfO_2$, TaN, and TiN, high-k dielectric layer 54 comprises $HfTaTiO_x$ incorporated with N after annealing.

Figure 9:
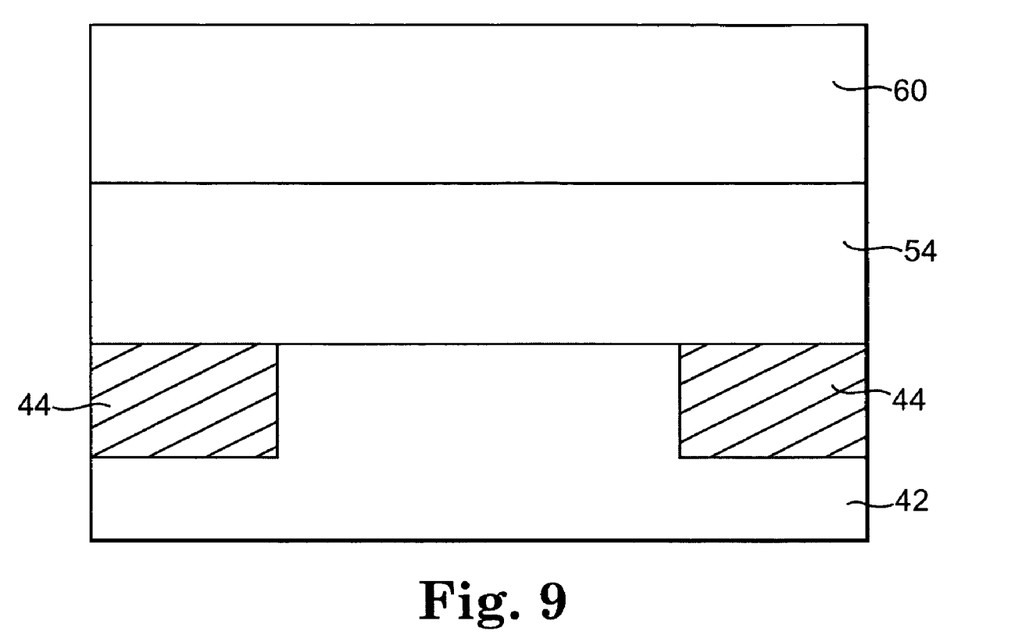
FIG. 9 is a diagram illustrating a cross-section of one embodiment of a substrate with isolation regions, high-k dielectric layer, and a gate electrode layer.

FIG. 9 is a diagram illustrating a cross-section of one embodiment of substrate 42 with isolation regions 44, high-k dielectric layer 54 after annealing, and gate electrode layer 60. Gate electrode layer 60 comprises aluminum, polysilicon, or other suitable conductive material. Gate electrode layer 60 is deposited on high-k dielectric layer 54 using CVD or other suitable deposition technique.

High-k dielectric layer 54 after annealing is a single layer comprising a mixture of all the materials deposited in material layer 54a of FIG. 4, material layers 54a and 54b of FIG. 5, material layers 54a-54c of FIG. 6, material layers 54a-54d of FIG. 7, material layers 54a-54e of FIG. 8a, or material layers 54a-54(n) of FIG. 8b. In one embodiment, high-k dielectric layer 54 has a k value greater than the individual k values of each of the materials deposited to form high-k dielectric layer 54. In one embodiment, high-k dielectric layer 54 has a k value within the range of 20 to 70.

Figure 10:
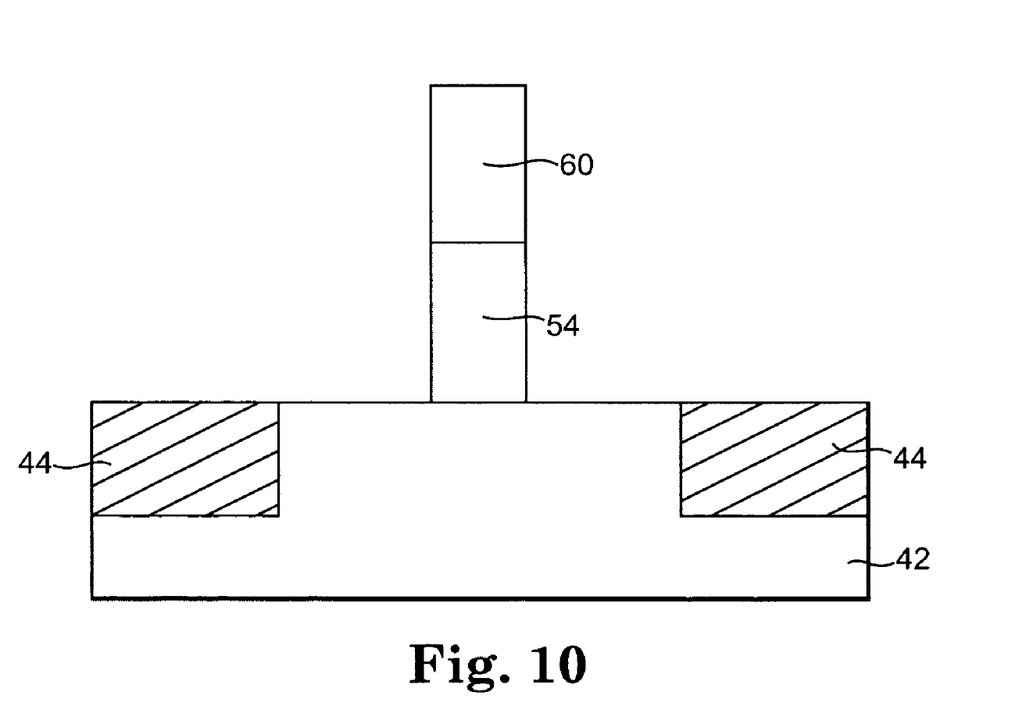
FIG. 10 is a diagram illustrating a cross-section of one embodiment of a substrate with isolation regions, high-k dielectric layer, and gate electrode layer after etching.

FIG. 10 is a diagram illustrating a cross-section of one embodiment of substrate 42 with isolation regions 44, high-k dielectric layer 54, and gate electrode layer 60 after portions of gate electrode layer 60 and high-k dielectric layer 54 have been etched away. A photoresist and etching process is used to remove the unwanted portions.

Figure 11:
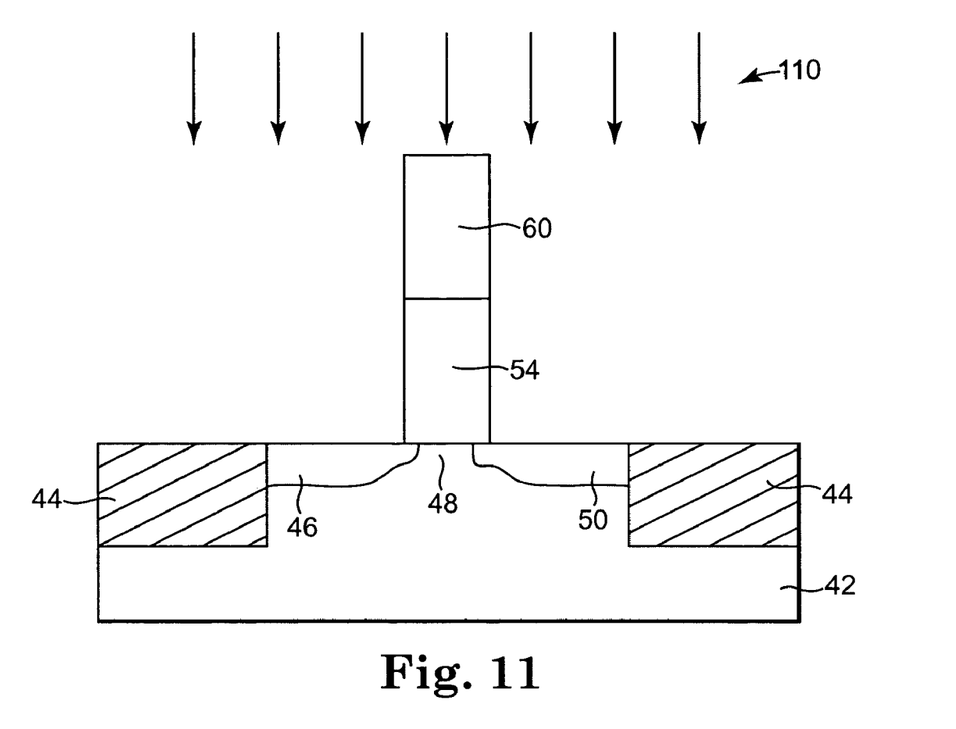
FIG. 11 is a diagram illustrating one embodiment of implantation of a cross-section of the substrate to form source and drain extension regions.

FIG. 11 is a diagram illustrating a cross-section of one embodiment of ion implantation 10 in a self-aligned process to form source extension region 46 and drain extension region 50. Substrate 42 is implanted with a species to form source extension region 46 and drain extension region 50. The implant species includes arsenic, phosphorous, boron, or other suitable species based upon the desired characteristics of transistor cell 40, such as whether transistor cell 40 is PMOS or NMOS.

Figure 12:
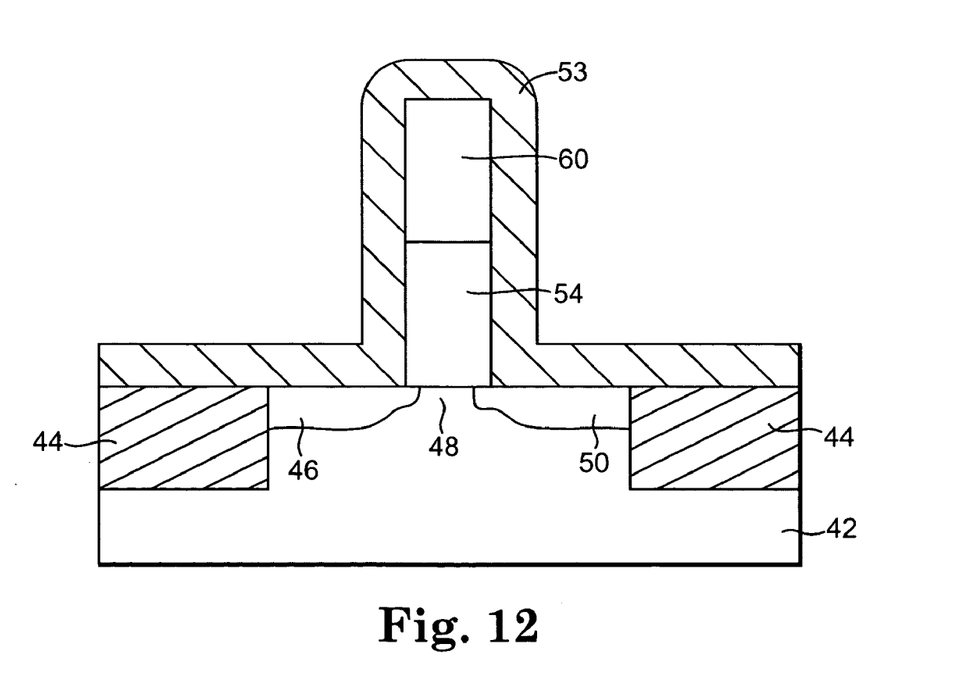
FIG. 12 is a diagram illustrating a cross-section of one embodiment of an oxide layer on a substrate with isolation regions, high-k dielectric layer, and gate electrode layer.

FIG. 12 is a diagram illustrating a cross-section of one embodiment of substrate 42 with isolation regions 44, high-k dielectric layer 54, gate electrode layer 60, and oxide layer 53. Oxide layer 53 is deposited on gate electrode layer 60, the sides of high-k dielectric layer 54, and on substrate 42. Oxide layer 53 includes $SiO_2$ or other suitable material. Oxide layer 53 is deposited using CVD or other suitable deposition technique.

Figure 13:
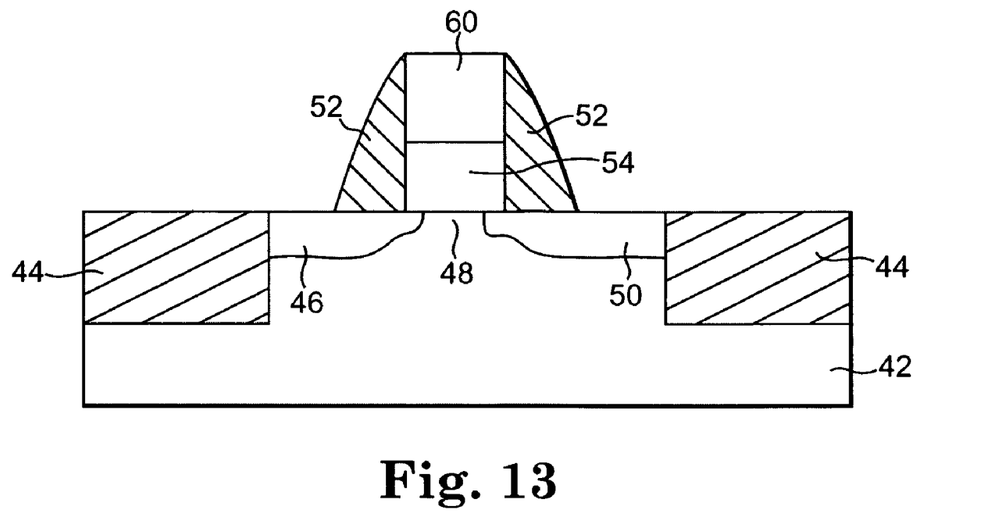
FIG. 13 is a diagram illustrating a cross-section of one embodiment of an oxide layer on a substrate with isolation regions, high-k dielectric layer, and gate electrode layer after etching the oxide layer to form spacers.

FIG. 13 is a diagram illustrating a cross-section of one embodiment of substrate 42 with isolation regions 44, high-k dielectric layer 54, gate electrode layer 60, and oxide layer 53 after etching to form spacers 52. A photoresist and etching process is used to remove unwanted portions of oxide layer 53 to form spacers 52.

Figure 14:
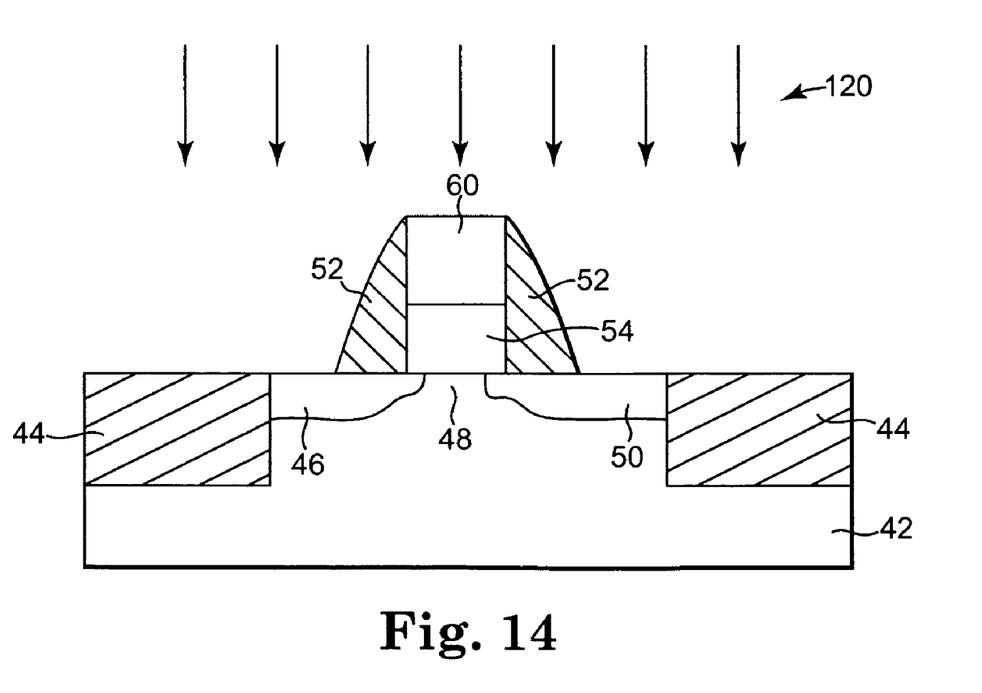
FIG. 14 is a diagram illustrating one embodiment of implantation of a cross-section of the substrate to form source and drain regions.

FIG. 14 is a diagram illustrating one embodiment of ion implantation 120 of a cross-section of substrate 42 to form source 46 and drain 50. Substrate 42 is implanted with a species to form source 46 and drain 50. The implant species includes arsenic, phosphorous, boron, or other suitable species based upon the desired characteristics of transistor cell 40, such as whether transistor cell 40 is a PMOS transistor cell or an NMOS transistor cell.

What is claimed is:

1. A semiconductor device comprising:
   a substrate including isolation regions and active regions;
   a high-k dielectric layer proximate the substrate, the high-k dielectric layer comprising a mixture formed by annealing at least one high-k material and at least one metal, the annealing to oxidize the metal; and
   a gate electrode proximate the high-k dielectric layer, wherein the high-k dielectric layer has a k value within a range of 30 to 70.

2. The semiconductor device of claim 1, wherein the mixture is formed by annealing a first high-k material layer and a first metal layer proximate the first high-k material layer.

3. The semiconductor device of claim 1, wherein the high-k dielectric layer has a thickness within a range of 20 Å to 100 Å.

4. The semiconductor device of claim 1, wherein the high-k material comprises one of $Si_3N_4$, $Al_2O_3$, $Ta_2O_5$, $HfO_2$, $TiO_2$, $HfSiO_x$, $ZrO_2$, $ZrSiO_x$, $La_2O_3$, $CeO_2$, $Bi_4Si_2O_{12}$, $WO_3$, $Y_2O_3$, $LaAlO_3$, BST, PST, PZN, PZT, and PMN.

5. The semiconductor device of claim 4, wherein the metal comprises one of TiN, HfN, TaN, ZrN, and LaN.

6. A semiconductor device comprising:
   a substrate including isolation regions and active regions;
   a high-k dielectric layer proximate the substrate, the high-k dielectric layer comprising a mixture formed by annealing at least one high-k material and at least one metal, the annealing to oxidize the metal; and
   a gate electrode proximate the high-k dielectric layer, wherein the high-k dielectric layer comprises $HfTaTiO_c$.

7. The semiconductor device of claim 6, wherein the high-k dielectric layer is incorporated with N.

8. A transistor comprising:
   a gate electrode;
   a high-k dielectric layer proximate the gate electrode, the high-k dielectric layer comprising a mixture formed by annealing a high-k material and a metal, the annealing to oxidize the metal; and
   a substrate comprising an active region, the substrate proximate the high-k dielectric layer,
   wherein the high-k dielectric layer has a k value greater than 30.

9. The transistor of claim 8, wherein the high-k material comprises one of $Si_3N_4$, $Al_2O_3$, $Ta_2O_5$, $HfO_2$, $TiO_2$, $HfSiO_x$, $ZrO_2$, $ZrSiO_x$, $La_2O_3$, $CeO_2$, $Bi_4Si_2O_{12}$, $WO_3$, $Y_2O_3$, $LaAlO_3$, BST, PST, PZN, PZT, and PMN.

10. The transistor of claim 9, wherein the metal comprises one of TiN, HfN, TaN, ZrN, and LaN.

11. The transistor of claim 8, wherein the gate electrode comprises one of aluminum, polysilicon, TiN, TaN, HfN, RuN, WN, W, MoN, TaSiN, RuSiN, WSiN, HfSiN, and TiSiN.

12. A transistor comprising:
   a gate electrode;
   a high-k dielectric layer proximate the gate electrode, the high-k dielectric layer comprising a mixture formed by annealing a high-k material and a metal, the annealing to oxidize the metal; and
   a substrate comprising an active region, the substrate proximate the high-k dielectric layer,
   wherein the high-k dielectric layer comprises $HfTaTiO_x$.

13. The transistor of claim 12, wherein the high-k dielectric layer is incorporated with N.

14. The transistor of claim 8, wherein the transistor is an NMOS transistor.

15. The transistor of claim 8, wherein the transistor is a PMOS transistor.

16. A semiconductor device comprising:
   a substrate including isolation regions and active regions;
   a high-k dielectric layer proximate the substrate, the high-k dielectric layer having a first k value and comprising a mixture formed by annealing at least a first layer of material having a second k value and a second layer of material having a third k value, the first k value greater than the second k value and the third k value; and
   a gate electrode proximate the high-k dielectric layer, wherein the first k value is greater than 30.

17. The semiconductor device of claim 16, wherein the first layer of material comprises a high-k material and the second layer of material comprises a metal.

18. The semiconductor device of claim 16, wherein the first layer of material comprises a high-k material and the second layer of material comprises a material that acts as a metal.

19. The semiconductor device of claim 16, wherein the high-k dielectric layer is incorporated with N.

* * * * *